United States Patent
Schwendinger et al.

(10) Patent No.: US 7,746,242 B2
(45) Date of Patent: Jun. 29, 2010

(54) LOW BATTERY INDICATOR

(75) Inventors: Paul G. Schwendinger, St. Louis Park, MN (US); David P. Mulhouse, Minnetonka, MN (US); Marcus D. Stoner, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 1612 days.

(21) Appl. No.: 10/895,499

(22) Filed: Jul. 21, 2004

(65) Prior Publication Data

US 2006/0017581 A1  Jan. 26, 2006

(51) Int. Cl.
*G08B 21/00* (2006.01)

(52) U.S. Cl. .............. 340/636.19; 340/636.1; 340/636.12; 340/635; 340/691.6; 340/692; 340/693.7; 320/114; 320/145; 320/132; 320/128

(58) Field of Classification Search ............. 340/363.1, 340/526, 527, 528, 636.1, 635, 628, 636.19, 340/636.12, 691.6, 692, 693.7; 320/114, 320/128, 132, 145, 164
See application file for complete search history.

(56) References Cited

U.S. PATENT DOCUMENTS

| | | | |
|---|---|---|---|
| 4,506,827 A | | 3/1985 | Jamieson et al. |
| 4,622,544 A | | 11/1986 | Bially et al. |
| 4,660,027 A | * | 4/1987 | Davis .................... 340/636.15 |
| 5,034,986 A | * | 7/1991 | Karmann et al. ............ 382/103 |
| 5,053,752 A | | 10/1991 | Epstein et al. |
| 5,065,083 A | * | 11/1991 | Owens ....................... 320/127 |
| 5,140,310 A | | 8/1992 | DeLuca et al. |
| 5,238,184 A | | 8/1993 | Adams |
| 5,251,813 A | | 10/1993 | Kniepkamp |
| 5,386,577 A | | 1/1995 | Zenda |
| 5,442,345 A | * | 8/1995 | Kwon ......................... 340/7.37 |
| 5,459,671 A | * | 10/1995 | Duley ........................... 702/63 |
| 5,513,175 A | * | 4/1996 | Ichii et al. .................... 370/251 |
| 5,565,782 A | * | 10/1996 | Sato ............................ 324/435 |
| 5,686,896 A | * | 11/1997 | Bergman .................. 340/636.1 |
| 6,081,197 A | | 6/2000 | Garrick et al. |
| 6,118,384 A | * | 9/2000 | Sheldon et al. ......... 340/636.15 |
| 6,121,875 A | | 9/2000 | Hamm et al. |
| 6,236,326 B1 | | 5/2001 | Murphy |
| 6,310,556 B1 | * | 10/2001 | Green et al. ........... 340/636.15 |
| 6,483,274 B2 | * | 11/2002 | Lee .............................. 320/132 |
| 2003/0123224 A1 | | 7/2003 | LaCroix et al. |

(Continued)

OTHER PUBLICATIONS

Aube Technologies, Electronic Thermostat for Heating System Model TH135-01, 5 pages, Aug. 14, 2001.

(Continued)

*Primary Examiner*—Tai T Nguyen
(74) *Attorney, Agent, or Firm*—Crompton Seager & Tufte LLC

(57) ABSTRACT

Electronic devices that include batteries can be adapted to provide one or more indications of a low battery condition. An electronic device such as a controller can include a battery and can be adapted to determine a first low battery condition. A first indication can be provided in response to the first low battery condition. In some cases, a second battery condition can be determined and a second indication can be provided in response to the second battery condition. The indications provided to the user can be made progressively more noticeable over time, until the battery is replaced.

45 Claims, 11 Drawing Sheets

U.S. PATENT DOCUMENTS

2004/0245352 A1* 12/2004 Smith .................... 236/94

OTHER PUBLICATIONS

Aube Technologies, TH140-28 Electronic Programmable Thermostat, Installation Instructions and User Guide, pp. 1-4, Jan. 22, 2004.
Braeburn Model 3000 Owner's Manual, pp. 1-13, 2001.
Braeburn Model 5000 Owners Manual, pp. 1-17, 2001.
BRK First Alert, User's Manual, Smoke and Fire Alarms, pp. 1-7, Nov. 2002.
Carrier Microelectronic Programmable Thermostat Owner's Manual, pp. 1-24, May 1994.
Danfoss RT51/51RF & RT52/52RF User Instructions, 2 pages, Jun. 2004.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, MagicStat® CT3200 Programmable Thermostat, Installation and Programming Instructions, pp. 1-24, 2001.
Ritetemp Operation 8050, 5 pages, Jun. 26, 2002.
Totaline Star CPE230RF, Commercial Programmable Thermostat Wireless Transmitter, Owner's Manual, pp. 1-16, Oct. 1998.

* cited by examiner

LOW BATTERY INDICATOR

TECHNICAL FIELD

The present invention relates generally to electronic devices that include batteries, and more specifically, to electronic devices such as controllers that are adapted to provide one or more indications of a battery condition such as a low battery condition.

BACKGROUND

A variety of electronic devices include at least one battery as a power source. In some instances, the battery provides auxiliary or backup power while a different source such as house current provides main power to the device. In many instances, a battery or perhaps a set of several batteries provide all of the power necessary to operate the electronic device. Any device that relies on a battery for either auxiliary or main power is susceptible to low battery issues.

In some cases, loss or impending loss of battery power can be annoying but is of little or no real significance. Examples of such situations include battery-powered hand held games and remote controls for audio/visual equipment such as stereos and televisions. When the game ceases to function or the remote no longer operates the stereo or television, a user can simply replace the battery or batteries.

In other cases, however, the loss or impending loss of battery power can have significant detrimental impact. An example of such a situation includes information storage devices such as a PDA (personal digital assistant). While many such devices have rechargeable batteries or include a main battery source and a backup battery source, these devices often still can be susceptible to battery problems.

Another example of a situation in which the loss or impending loss of battery power would have a negative impact includes devices that are part of security systems. Security systems can include a variety of components that for convenience are battery-powered yet contain data that has been entered by a user or an installation expert. The loss of such data could be an inconvenience. Worse, it is conceivable that the loss or impending loss of battery power in particular security systems devices could render the security system at least partially inoperable.

Yet another example of a situation in which the loss or impending loss of battery power can have a significant negative impact includes electronic devices known as controllers. Typical electronic controllers can be battery-powered and can be configured to control or operate a variety of different systems and/or equipment. An HVAC system is an example of such a system that can be controlled by a battery-powered controller. An HVAC controller can be used to regulate a variety of home heating, cooling and ventilating equipment such as furnaces, boilers, air conditioners, air exchangers, humidifiers, dehumidifiers, filtration units, UV lamps, and the like. Some HVAC controllers are considered to be thermostats.

Loss of battery power in an HVAC controller can have multiple impacts. Many HVAC controllers are user-programmable to include a number of time and temperature set points. Loss of battery power can cause a loss of these set points, which can require the user to tediously re-enter a relatively large amount of data. A loss of battery power can in some instances cause the HVAC controller to lose its ability to receive signals from and/or send command signals to various pieces of equipment in the system. This can mean, for example, that the furnace may shut down on a cold winter day or the air conditioning may shut down on a hot mid-summer day. Clearly, these are undesirable consequences.

Some battery-powered devices include attempts at warning a user that a loss of battery power is imminent. For example, some devices such as thermostats, detect a first low voltage level of a battery, and display a "REPLACE BATTERY" message on the display of the thermostat at a first blink rate. When a second lower voltage level is subsequently detected, the thermostat begins blinking the "REPLACE BATTERY" message at a higher blink rate. When a third lower voltage level is detected, the thermostat may stop operating and turn all control outputs to the off position, and display only the blinking "REPLACE BATTERY" message and not any other control parameters. These features are provided in, for example, the Chronotherm III product family of thermostats, available from the assignee of the present invention. It has been found, however that users often do not heed or even notice such warnings until the thermostat stops operating.

Thus, a need remains for methods of indicating a low battery condition within an electronic device such that a user actually takes notice of the indication. A need also remains for controllers adapted to indicate a low battery condition in such a way so that a user takes the appropriate actions in replacing the battery.

SUMMARY

The present invention relates generally to electronic devices that include batteries, and more particularly, to electronic devices such as controllers that are adapted to provide one or more indications of a battery condition such as a low battery condition. In one illustrative embodiment, a first low battery condition is detected, and a first indication to the user is provided. If the user does not notice or otherwise replace the battery, a second low battery condition is eventually detected, and a second indication is provided. In some cases, the second indication can be different from the first indication. For example, the indications provided to the user can be made progressively more noticeable over time, until the battery is replaced. In some cases, a timer may be used to determine when the first and/or second indications are provided, and in some cases, the timer is started after a low battery condition is detected.

In some cases, the indications can be audible and/or visual. For example, and in one illustrative embodiment, the first indication can include one or more first audible indications, such as a series of beeps. Likewise, the second indication can include one or more second audible indications, such as a series of beeps. The duration, interval, volume level, pitch and/or any other suitable characteristics of the audible indications can be changed over time, and in some cases, made more noticeable over time until the battery is replaced. For example, the first audible indications can be shorter in duration, spaced by a longer interval, have a lower volume and/or pitch than the second audible indications.

Alternatively, or in addition, the first indication can include one or more visual indications. For example, in one illustrative embodiment, the first indication can include a flashing or blinking LED. In another illustrative embodiment, the first indication can include a visual indication or message on a display of a controller, if present. Likewise, the second indication can include one or more visual indications such as a flashing LED visual indication and/or message on a display, and/or another suitable visual indication. The indications may be changed over time, and in some cases, made more noticeable over time until the battery is replaced.

In some cases, the indications can correspond to changes in one or more control parameters of the controller. For example, for an HVAC controller, the indications can correspond to changes in set point, cycle rate, allowed temperature swing, or any other desired control parameter of the HVAC controller. In one example, the first indication may correspond to a first change in set point, and the second indication may correspond to a second change in set point, wherein the second change in set point is larger than the first change in set point. Cycle rate, allowed temperature swing, and/or other control parameters may be similarly changed, if desired.

In some illustrative embodiments, and once the controller determines that a low battery condition exists, the controller may provide one or more low battery indication(s) to a remote device that is remote from the controller. For example, a low battery indication may be provided to one or more remote receiving devices such as a security system, a phone system, a handheld device, a personal computer or any other suitable remote receiving device. In one example, if the controller is a thermostat, the thermostat may provide a low battery indication to a security system, which may in some cases have a better display and/or may have a display that is viewed more often by a user.

Some thermostats do not have a particularly good user interface, and in some cases, no LCD display or the like. In such cases, providing a low battery indication to another remote receiving device to help alert the user of the low battery condition can be useful. This is also true for other controller devices, such as battery powered temperature sensors, battery powered motion sensors and the like. In some cases, these controllers may provide a low battery indication via an RF or other wireless signal to a remote receiving device.

The low battery indication may be provided from the controller to a remote device using any suitable communication path. The communication path may be, for example, a wire, a bus, a phone system, a cellular network, the Internet, an RF link, etc. In some cases, the controller may provide, for example, a text message or an email message to a cellular phone, a handheld device such as a Personal Digital Assistant, a personal computer and/or any other suitable device. In some cases, the controller may call a user's phone (cellular or land line phone), and provide a voice notification of the low battery indication.

The above summary of the present invention is not intended to describe each disclosed embodiment or every implementation of the present invention. The Figures, Detailed Description and Examples which follow more particularly exemplify these embodiments.

BRIEF DESCRIPTION OF THE FIGURES

The invention may be more completely understood in consideration of the following detailed description of various embodiments of the invention in connection with the accompanying drawings, in which.

Figure 1:
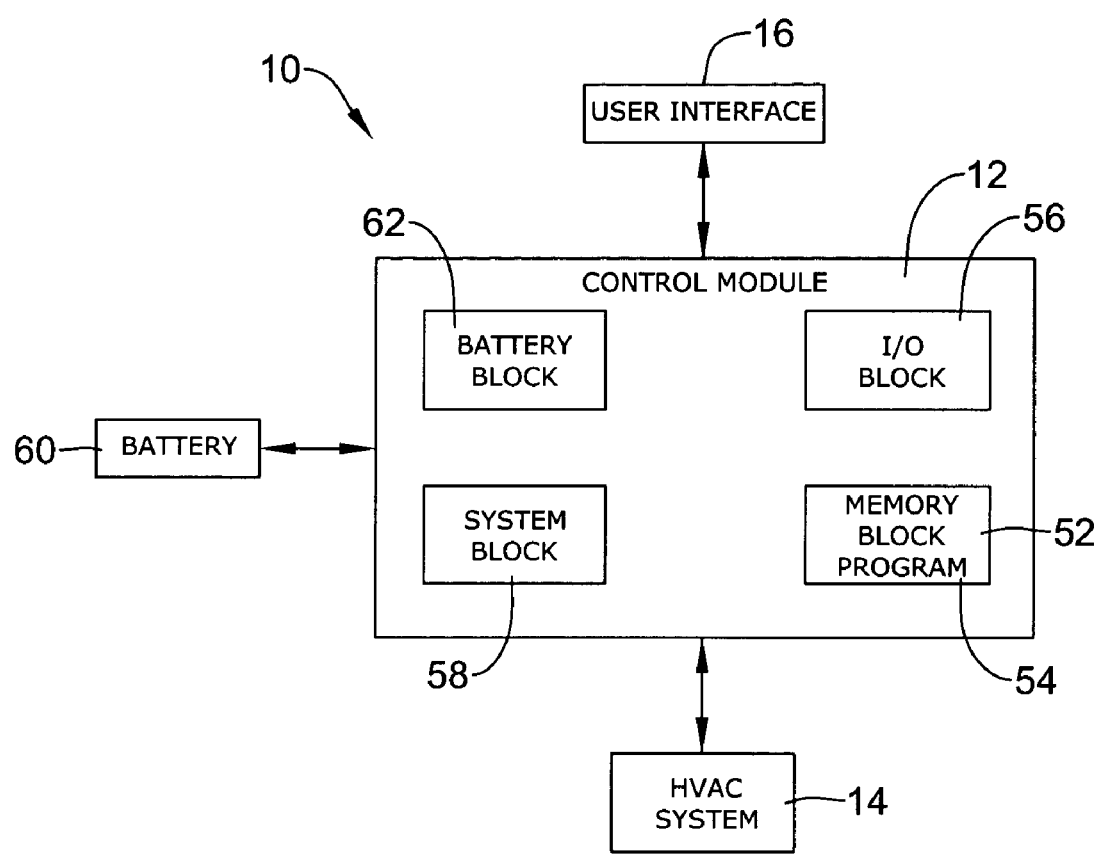
FIG. 1 is a schematic illustration of a controller in accordance with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

The present invention generally relates to electronic devices that employ a battery as either a main or an auxiliary power supply. The term "battery" is interchangeably used to refer to either a single battery or several batteries connected either in series or in parallel in order to provide a desired voltage/power level. In particular embodiments, the present invention pertains to controllers that employ a battery as a primary power supply. While the invention is applicable to a wide variety of electronic devices, for purposes of illustration the invention is described below with reference to HVAC controllers.

Figure 2:
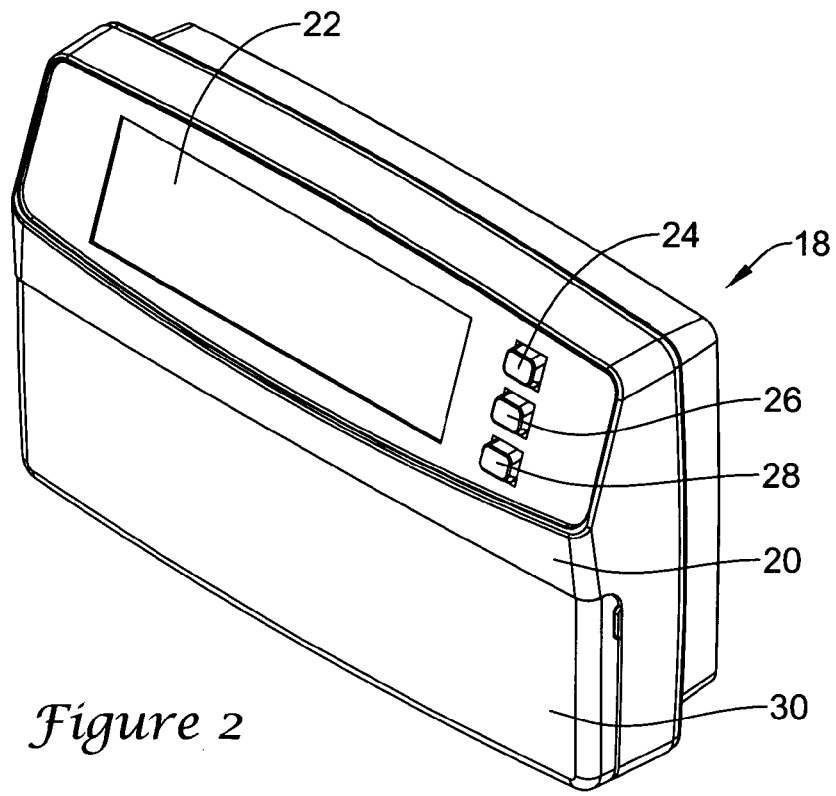
FIG. 2 is a perspective view of a thermostat in accordance with an embodiment of the present invention.

To with, FIG. 1 is a schematic illustration of a controller 10 in accordance with an illustrative embodiment of the present invention. Controller 10 includes a control module 12 that is configured to monitor and control any variety of devices that are included in HVAC system 14. Controller 10 also includes a user interface 16 that is configured to provide communication between control module 12 and a user. User interface 16 can be used to communicate status of HVAC system 14 to the user, and/or accept input from the user. User interface 16 can take a wide variety of different forms. In some embodiments (not illustrated), user interface 16 can include a touch screen that can be adapted to provide information to the user as well as accept information from the user. In other embodiments, the user interface 16 may include a non-touch screen display, such as an LCD and/or dot matrix display and a key pad—an illustrative embodiment of which is shown in FIG. 2. In yet other embodiments, the user interface 16 may include one or more knobs, buttons and/or switches—an illustrative embodiment of which is shown in FIG. 3.

FIG. 2 illustrates an HVAC controller 18 that includes a housing 20 and a display 22. In some embodiments, display 22 can be an LED display, an LCD display, or any other suitable display format discernible to the human eye. Illustrative HVAC controller 18 also includes an up button 24, a down button 26 and an information button 28. Up button 24 can be used for increasing the value of a selected parameter while down button 26 can be used for decreasing the value of a selected parameter. Information button 28 can be used by the user to gain additional information from HVAC controller 18. Illustrative HVAC controller also includes a door 30 that can swing down to gain access to additional programming keys.

Figure 3:
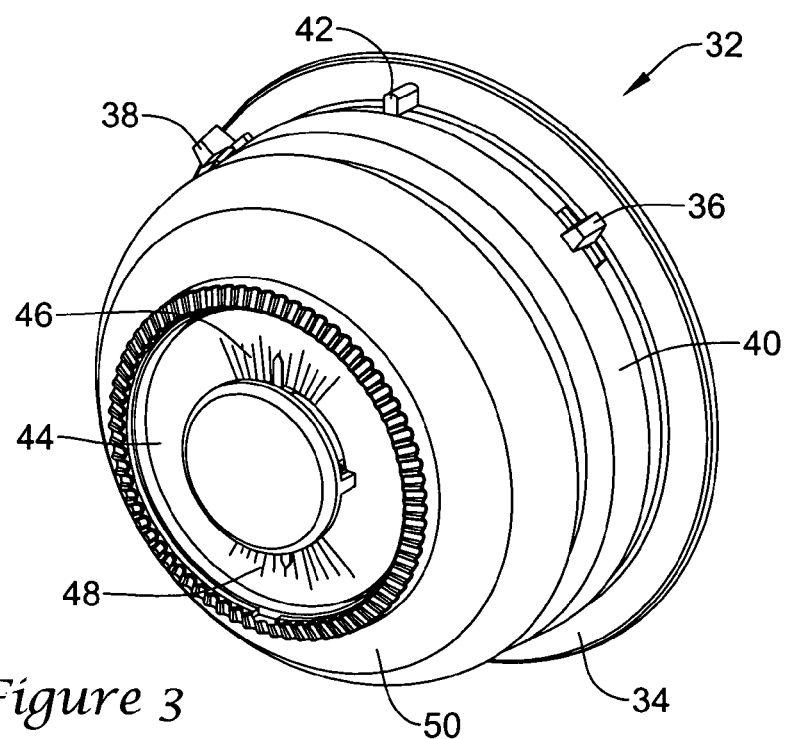
FIG. 3 is a perspective view of a thermostat in accordance with another embodiment of the present invention.

FIG. 3 shows an illustrative thermostat 32 that can be used to operate and monitor HVAC system 14 (FIG. 1). Illustrative thermostat 32 includes a base plate 34 that is configured to be wall-mounted. A FAN ON/AUTOMATIC switch 36 is disposed on base plate 34 and can instruct control module 12 (FIG. 1) to operate a blower motor at all times or perhaps only when other equipment such as a furnace or air conditioner is running. A COOL/OFF/HEAT switch 38 is also disposed on base plate 34. COOL/OFF/HEAT switch 38 can instruct control module 12 (FIG. 1) to selectively engage or disengage air conditioning and heating equipment.

The illustrative thermostat 32 includes an intermediate housing 40 adapted to snap or otherwise attaché to base plate 34. A light source 42 is shown extending through intermediate housing 40. Light source 42 can be, for example, an LED, a light pipe optically coupled to an LED, or any other suitable light source. Use of light source 42 will be described in greater detail hereinafter. An outer housing 50 is shown disposed over intermediate housing 40.

The illustrative thermostat 32 also includes a scale plate 44 that can include indicia such as, for example, temperature indicia for both a current temperature and a temperature set point. In some embodiments, scale plate 44 includes a temperature set point scale 46 and a current temperature scale 48 and thus may function in part as user interface 16 (FIG. 1). In some embodiments in which an environment is zoned into two or more distinct zones, each zone may include its own thermostat. Each of the thermostats can function in part as user interface 16.

Referring back to FIG. 1, control module 12 may include a memory block 52 that can store the value of one or more parameters. Memory block 52 also may store a program 54 that controls the operations of controller 10 and hence the operations of HVAC system 14. When controller 10 is an HVAC controller, and in some illustrative embodiments, program 54 can include instructions to turn HVAC equipment 14 on or off based on a timed schedule. The timed schedule can be configured to provide for continuous control throughout the day, or the timed schedule can be configured to provide for several control time periods each day. Each control time period can have a different set point, a different circulation mode, and/or different other control parameters, as desired. In some embodiments, the timed schedule can include four periods that correspond to, for example in residential use, when a user is likely to wake up in the morning, leave for work, return from work, and go to sleep. These periods are often referred to as the WAKE, LEAVE, RETURN, and SLEEP periods.

The illustrative controller 10 also includes an I/O BLOCK 56 that may be used to control information flowing between control module 12 and user interface 16. A SYSTEM BLOCK 58 may be provided to control information flowing between control module 12 and HVAC system 14. SYSTEM BLOCK 58 can, for example, send commands to HVAC system 14 and receive feedback from HVAC system 14.

The illustrative control module 12 is powered at least in part by a battery 60, and may include a BATTERY BLOCK 62 that is adapted to monitor the condition of the battery 60. As control module 12 consumes power in operation, battery 60 will slowly degrade. BATTERY BLOCK 62 can include circuitry and/or software that monitors the voltage produced by the battery 60, and in some cases, provides a low battery indication to the user when appropriate.

At some point, battery 60 will reach a voltage level that is insufficient to fully operate controller 10. This voltage level can vary, depending upon the power and/or voltage requirements of controller 10. For example, in some embodiments, battery 60 is capable of fully powering controller 10 at a voltage level that is equal to 40 percent or less of the originally fully charged voltage level. In some embodiments, battery 60 is capable of fully powering controller 10 at a voltage level that is 30 percent of the originally fully charged voltage level, or perhaps 20 or even 10 percent of the originally fully charged voltage level.

BATTERY BLOCK 62 monitors the remaining charge available in battery 60 using any suitable circuit and/or software. Depending on the power requirements of controller 10, BATTERY BLOCK 62 can be adapted to provide control module 12 with a low battery signal or signals once the voltage level of the battery 60 drops to a predetermined level. In one illustrative embodiment, a low battery signal will be generated when the voltage level of the battery 60 drops to a predetermined voltage level that is still above the minimum voltage level required to power the controller 10.

The voltage level at which a low battery signal is generated may be made to depend on the battery draw of the particular controller 10. For example, in some cases, it may be desirable to provide a low battery signal at a given time before it is expected that the battery will fail to power the controller 10. Thus, and in some embodiments, if controller 10 has a relatively high power requirement, and thus drains battery 60 relatively faster than if controller 10 had a relatively low power requirement, BATTERY BLOCK 62 may be configured to provide the low battery signal at a relatively higher voltage level of the battery 60. Conversely, BATTERY BLOCK 62 may be configured to provide a low battery signal at a relatively lower low voltage level if controller 10 has a relatively lower power requirement.

In some embodiments, BATTERY BLOCK 62 can be configured to provide several low battery signals. In the higher power consumption example given above, BATTERY BLOCK 62 may, for example, provide a first low battery signal when the voltage level of the battery 60 reaches 50 percent of its fully charged capacity. BATTERY BLOCK 62 may then provide a second low battery signal when the voltage level of the battery 60 reaches, for example, 40 percent of its fully charged capacity. A third low battery signal may be generated when the voltage level of the battery reaches 30 percent of capacity, and so on. In some embodiments, a number of low battery signals can be generated as the available capacity remaining in battery 60 continues to drop closer and closer to a minimum voltage level required to power controller 10.

In some embodiments, one or more low battery signals may be generated merely after the passage of a predetermined time period. The predetermined time period may be determined by characterizing the battery voltage of batteries over time when used in the particular controller. Since the power draw of the particular controller can often be relatively predictable, the point or points at which a low battery signal(s) should be generated can also be relatively predictable.

In some embodiments, a first low battery voltage may be detected by the BATTERY BLOCK 62, and then subsequent low battery signals may be provided based on the passage of predetermined time periods.

A low battery signal or a series of low battery signals generated by BATTERY BLOCK 62 can trigger one or a series of indications to a user that the performance of battery 60 is degrading. In some embodiments, the one or series of indications can be provided in a variety of ways. Examples include audio indications, visual indications and/or changes in one or more control parameters, to name a few.

Figure 4:
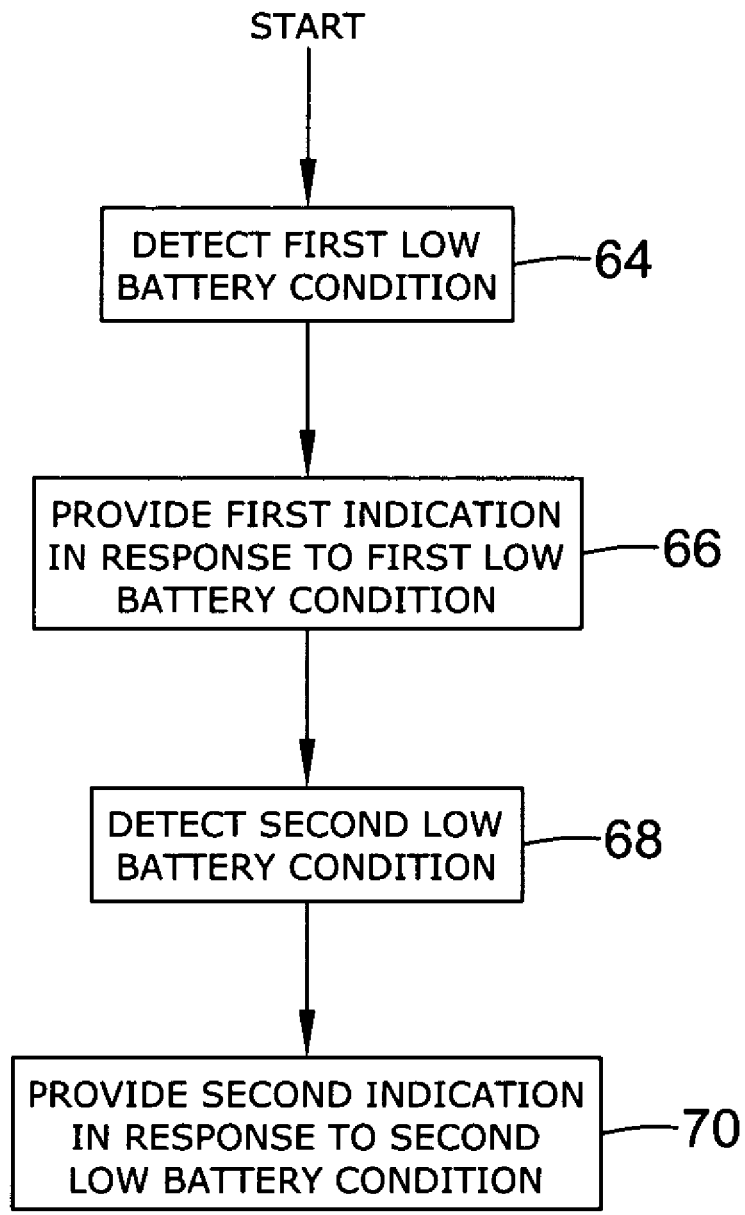
FIG. 4 is a flow diagram showing an illustrative method that may be implemented by the controller of FIG. 1.

FIG. 4 is a flow diagram showing an illustrative method that may be implemented by controller 10 (FIG. 1). At block 64, BATTERY BLOCK 62 (FIG. 1) detects a first low battery condition when the battery reaches a first predetermined low level. Control passes to block 66, where I/O BLOCK 56 (FIG. 1) sends a signal to user interface 16 to provide a first indication to the user in response to the first low battery condition. At block 68, BATTERY BLOCK 62 detects a second low battery condition when the battery reaches a second predetermined low level. In some embodiments, the second low battery condition can correspond to a battery voltage level that is less than the first low battery condition.

In some embodiments, BATTERY BLOCK 62 (FIG. 1) can continuously monitor the voltage (or current) of the battery 60, while in other embodiments the voltage (or current) of the battery 60 can be monitored periodically or intermittently. For example, BATTERY BLOCK 62 may check the voltage level of the battery 60 every five minutes, every ten minutes, or any other suitable time period. In some embodiments, the time period between successive battery checks can decrease as the voltage level of the battery 60 decreases.

In any event, when block 68 detects the second low battery condition, control passes to block 70, where I/O BLOCK 56 (FIG. 1) sends a signal to user interface 16 to provide a second indication to the user in response to the second low battery condition. In some embodiments, the second indication can be made more noticeable, be more aggressive, and/or denote a greater sense of urgency than the first indication.

For example, if the first and second indications are audible indications, the duration, interval, volume level, pitch or any other audible suitable characteristics of the second indication can be made more noticeable than that of the first indication, if desired. In another example, if the first and second indications are visual indications, the brightness, flash rate, display message, display characteristics, display functionality, blanking out of the display, or any other suitable visual characteristics of the second indication can be made more noticeable than that of the first indication, if desired. In yet another example, if the first and second indications correspond to change in a control parameter, the second indication may change the control parameter more than the first indication.

In some embodiments, the first indication can be visual and the second indication can be audible, the first indication can be audible and the second indication can be visible, the first indication can be audible and/or visual and the second indication can correspond to a change in one or more control parameters, the first indication can correspond to a change in one or more control parameters and the second indication can be audible and/or visual, the first indication can correspond to a control parameter and be audible and/or visual, and the second indication can correspond to a control parameter and be audible and/or visual, or any other combination or permutation of audible, visual and/or changes in control parameters, as desired. Also, there may be only one indication when the battery reaches a predetermined low voltage (or current) level, or more than two indications each corresponding to a different predetermined voltage (or current) level, as desired.

In some cases, a low battery level may be reached, at which point at least some of the main functions of the controller may be turned off or disabled. In some controllers such as some thermostats, the controller may need to turn on/off relay(s) to control the HVAC equipment. If the battery voltage drops too far, the controller may no longer be able to reliably turn on/off the relay(s). Thus, in accordance with some embodiments of the present invention, at least some of the functions of the controller may be intentionally disabled upon receiving a low battery condition, if desired. In some cases, when a particular low battery condition is determined (e.g. by detecting a low battery voltage and/or by tracking the passage of a predetermined time period), all of the functions of the controller may be intentionally disabled upon receiving a low battery condition until the battery is replaced. In some cases, at least some of the functions of the controller may be intentionally disabled upon receiving a first low battery condition, if desired.

Figure 5:
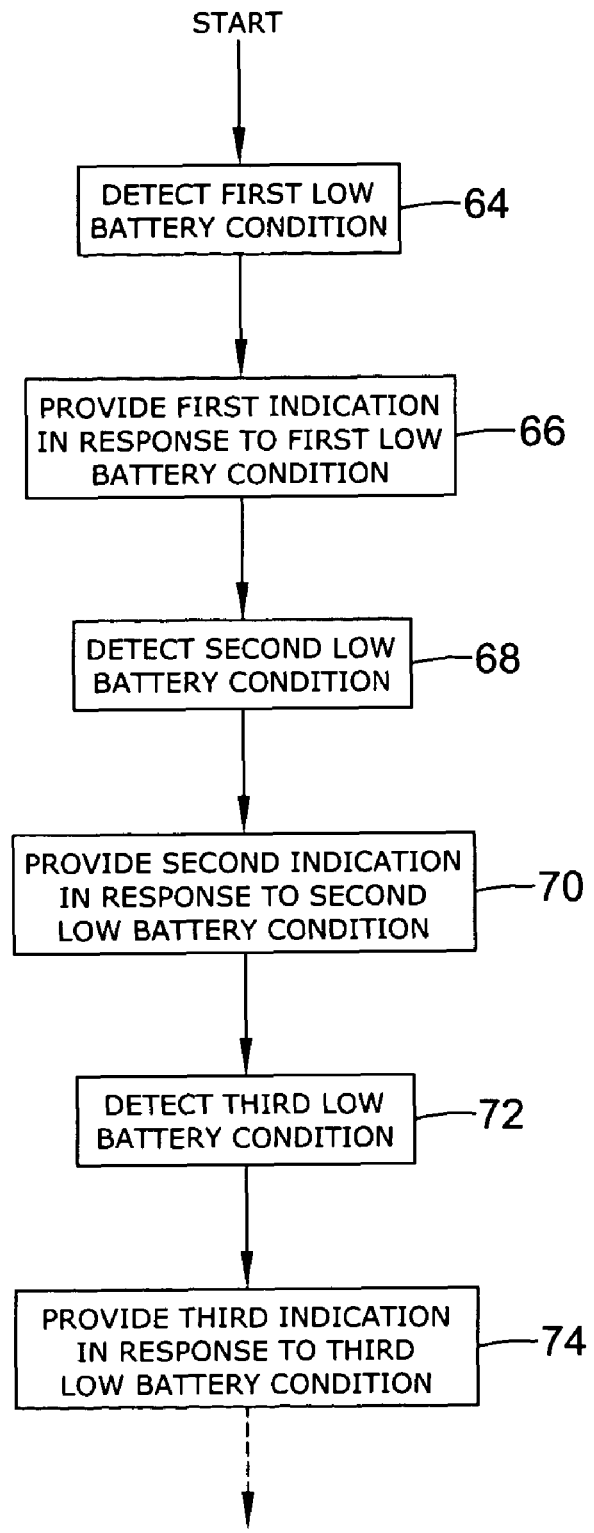
FIG. 5 is a flow diagram showing another illustrative method that may be implemented by the controller of FIG. 1.

FIG. 5 is a flow diagram showing another illustrative method that may be implemented by controller 10 (FIG. 1). At block 64, BATTERY BLOCK 62 (FIG. 1) detects a first low battery condition. Control passes to block 66, where I/O BLOCK 56 (FIG. 1) sends a signal to user interface 16 to provide a first indication to the user in response to the first low battery condition. At block 68, BATTERY BLOCK 62 detects a second low battery condition, which in the embodiment shown, corresponds to a lower battery voltage level than the first low battery condition.

Control then passes to block 70, where I/O BLOCK 56 (FIG. 1) sends a signal to user interface 16 (FIG. 1) to provide a second indication to the user in response to the second low battery condition. In some embodiments, the second indication can be made more noticeable, be more aggressive, and/or denote a greater sense of urgency than the first indication.

Control then passes to block 72, where BATTERY BLOCK 62 (FIG. 1) detects a third low battery condition, which in the embodiment shown, corresponds to a lower battery voltage level than the second low battery condition. Control passes to block 74, where I/O BLOCK 56 (FIG. 1) sends a signal to user interface 16 (FIG. 1) to provide a third indication to the user in response to the third low battery condition. In some embodiments, the third indication can be made more noticeable, be more aggressive, and/or denote a greater sense of urgency than the second indication.

While not explicitly shown in FIG. 5, BATTERY BLOCK 62 (FIG. 1) can continue to monitor the condition of battery 60 (FIG. 1) and can provide a series of additional low battery signals. I/O BLOCK 56 (FIG. 1) can continue to send a series of signals to user interface 16 (FIG. 1) to provide a series of increasingly urgent indications that battery replacement is becoming increasingly critical.

Figure 6:
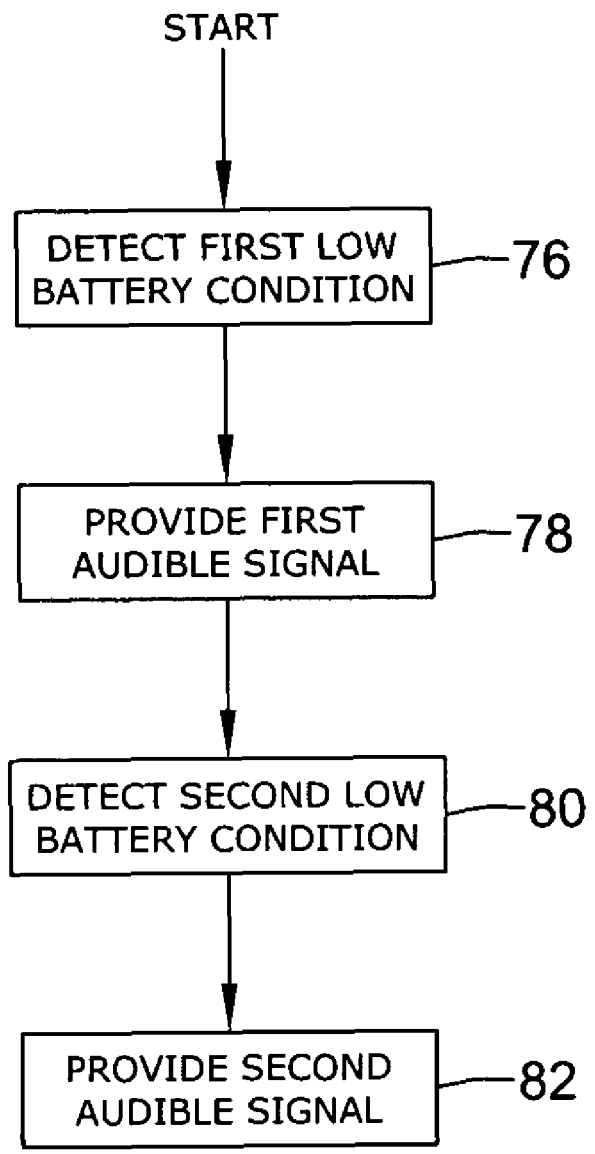
FIG. 6 is a flow diagram showing yet another illustrative method that may be implemented by the controller of FIG. 1.

As noted above, and in some embodiments, controller 10 (FIG. 1) can cause an audio indication through user interface 16 (FIG. 1). I/O BLOCK 56 (FIG. 1) can instruct user interface 16 (FIG. 1) to provide an audible signal such as a beep, click or similar sound, or a series of audible signals, if desired. Controller 10 (FIG. 1) can include a speaker (not illustrated) or other appropriate sound-causing apparatus. FIG. 6 is a flow chart of an illustrative method of the present invention, wherein the first indication and the second indication both include an audible indication. Control begins at block 76, where BATTERY BLOCK 62 (FIG. 1) detects a first low battery condition. At block 78, a signal is sent via I/O BLOCK 56 (FIG. 1) to user interface 16 to provide a first audible signal.

In some instances, the first audible signal can be a single sound, such as a beep, a chirp, a voice message, etc. In other instances, the first audible signal can be a series of sounds that each has a first duration and a first interval between successive sounds. For example, the first audible signal can be a series of one-second beeps, spaced five minutes apart.

Control then passes to block 80, where BATTERY BLOCK 62 (FIG. 1) detects a second low battery condition. At block 82, a signal is sent via I/O BLOCK 56 (FIG. 1) to user interface 16 (FIG. 1) to provide a second audible signal. In some instances, the second audible signal can be a single sound, such as a beep, a chirp, a voice message, etc. In other instances, the second audible signal can be a series of sounds that each has a second duration and a second interval between successive sounds.

In some embodiments, the second audible signal can be a series of sounds that have a longer duration, a shorter interval, or both, with respect to that of the first audible signal. For example, the second audible signal can be a series of one-second beeps, spaced one minute apart, or perhaps a series of two-second beeps spaced two minutes apart. Alternatively, or in addition, the second audible signal can be a series of sounds that have a different pitch, volume level or other characteristic than the first audible signal.

While not explicitly shown in FIG. 6, BATTERY BLOCK 62 (FIG. 1) can continue to monitor the condition of battery 60, and as more lower voltage levels are detected, provide a series of additional low battery signals, if desired. In some embodiments, I/O BLOCK 56 (FIG. 1) can continue to send a series of signals to user interface 16 (FIG. 1) to provide a series of increasingly urgent indications that battery replacement is becoming increasingly critical.

Figure 7:
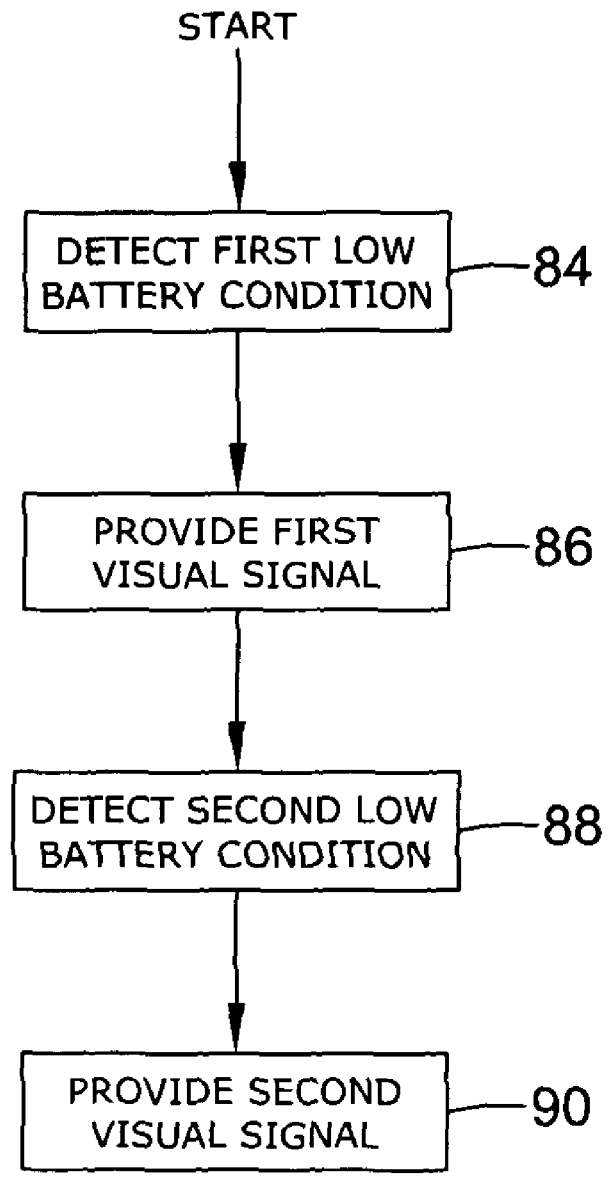
FIG. 7 is a flow diagram showing yet another illustrative method that may be implemented by the controller of FIG. 1.

In some instances, controller 10 (FIG. 1) can cause a visual indication via the interface 16. FIG. 7 is a flow chart of an illustrative method of the present invention, wherein the first indication and the second indication both include a visual indication. Control begins at block 84, where BATTERY BLOCK 62 (FIG. 1) detects a first low battery condition. At block 86, a signal is sent via I/O BLOCK 56 (FIG. 1) to user interface 16 to provide a first visual signal.

In some instances, the first visible signal can be a text or graphical message displayed on display 22 (FIG. 2). In some illustrative embodiments, the text or graphical message may be displayed along with other parameters that are normally displayed on the display 22 during controller operation. In other illustrative embodiments, the text or graphical message may replace some or all of the other parameters that are normally displayed on the display 22. In another illustrative embodiment, the controller may cause the display 22 to blink "on" and "off", or remain "off" or blank. In yet another illustrative embodiment, the controller may disable one or more functions of the controller, such as not allowing the user to change schedules and/or set points, until the battery is replaced, which may or may not be reflected on the display 22.

In some illustrative embodiments, the first visible signal may be provided by controlling a light source 42 (see, for example, FIG. 3). In one example, the first visible signal may be cause the light source 42 to be constantly "on" or "blink" on and off. If the first visible signal is provided for example by blinking an LED light such as light source 42 (FIG. 3), the visible signal can be a series of light-on, light-off events where light source 42 is lit for a period of perhaps one second, and then is off for a period of perhaps ten seconds.

Control then passes to block 88 where BATTERY BLOCK 62 (FIG. 1) detects a second low battery condition. At block 90, a signal is sent via I/O BLOCK 56 (FIG. 1) to user interface 16 (FIG. 1) to provide a second visible signal. In some embodiments, the second indication can be made more noticeable, be more aggressive, and/or denote a greater sense of urgency than the first indication. For example, a text message may begin flashing, all or part of the display may be disabled or left blank, or a light source such as light source 42 may begin blinking faster or the like. These are just a few examples.

While not explicitly shown in FIG. 7, it is contemplated that BATTERY BLOCK 62 (FIG. 1) may continue to monitor the condition of battery 60 (FIG. 1), and provide a series of additional low battery signals as further battery degradation is detected. I/O BLOCK 56 (FIG. 1) can continue to send a series of signals to user interface 16 (FIG. 1) to provide a series of increasingly urgent indications that battery replacement is becoming increasingly critical.

Figure 8:
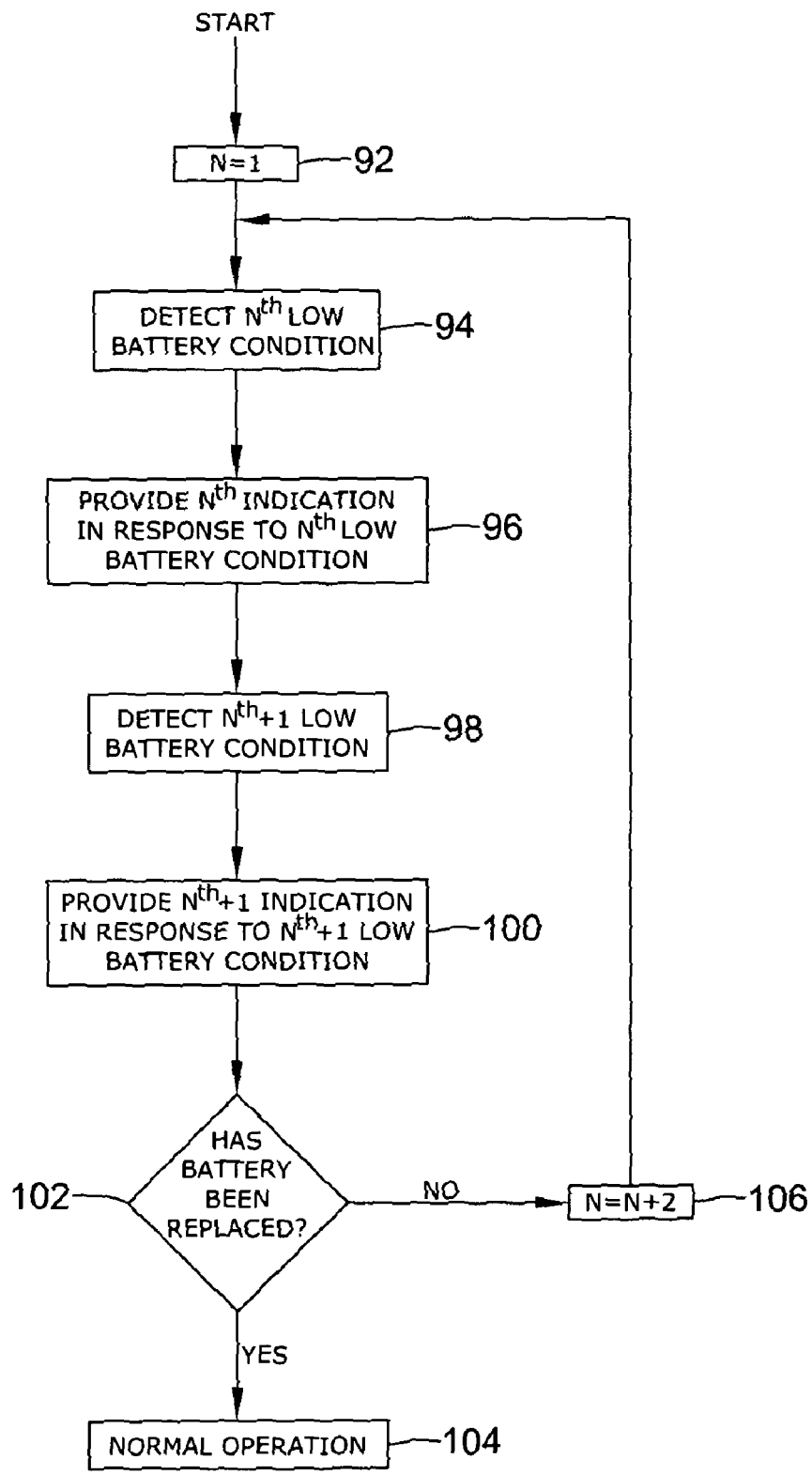
FIG. 8 is a flow diagram showing yet another illustrative method that may be implemented by the controller of FIG. 1.

FIG. 8 is a flow diagram that shows an illustrative method for detecting and indicating any number of low battery conditions. Control begins at block 92, where an integer "n" is set equal to an initial value of 1. At block 94, BATTERY BLOCK 62 (FIG. 1) detects an $n^{th}$ low battery condition. Control passes to block 96, where I/O BLOCK 56 (FIG. 1) sends a signal to user interface 16 to provide an $n^{th}$ indication to the user in response to the $n^{th}$ low battery condition. At block 98, BATTERY BLOCK 62 detects an $n^{th}+1$ low battery condition.

In at least some embodiments, the $n^{th}+1$ low battery condition can correspond to a lower battery voltage than the $n^{th}$ low battery condition. In some embodiments, BATTERY BLOCK 62 (FIG. 1) can continuously monitor the voltage of the battery 60, while in other embodiments, the voltage of the battery 60 may only be monitored intermittently. Control passes to block 100, where I/O BLOCK 56 (FIG. 1) sends a signal to user interface 16 (FIG. 1) to provide an $n^{th}+1$ indication to the user in response to the $n^{th}+1$ low battery condition. In some embodiments, the $n^{th}+1$ low battery condition can be made more noticeable, be more aggressive, and/or denote a greater sense of urgency than the $n^{th}$ indication.

Control then passes to decision block 102, where BATTERY BLOCK 62 (FIG. 1) determines whether battery 60 (FIG. 1) has been replaced or recharged. If battery 60 has been replaced or recharged, control passes to block 104 where controller 10 (FIG. 1) returns to normal operation. If battery 60 has not been replaced, control passes to block 106 where the integer "n" is incremented by two and control is passes back to block 94.

In some embodiments, and as mentioned above, the battery condition can be communicated to a user by changing one or more control parameters. Examples of control parameters can include temperature set points, allowable temperature swing control points, cycle rates, ventilation rate, humidity set point, and/or any other suitable control parameter of the controller. Allowable temperature swing control points can refer to how many degrees above or below a temperature set point the ambient temperature within a building or house is permitted to deviate before controller 10 instructs HVAC system 14 (FIG. 1) via SYSTEM BLOCK 58 (FIG. 1) to take appropriate action. Cycle rate can refer to how many times per hour HVAC system 14 is permitted to operate. In many cases, decreasing the cycle rate can have a similar effect to increasing the allowable temperature swing control point.

Figure 9:
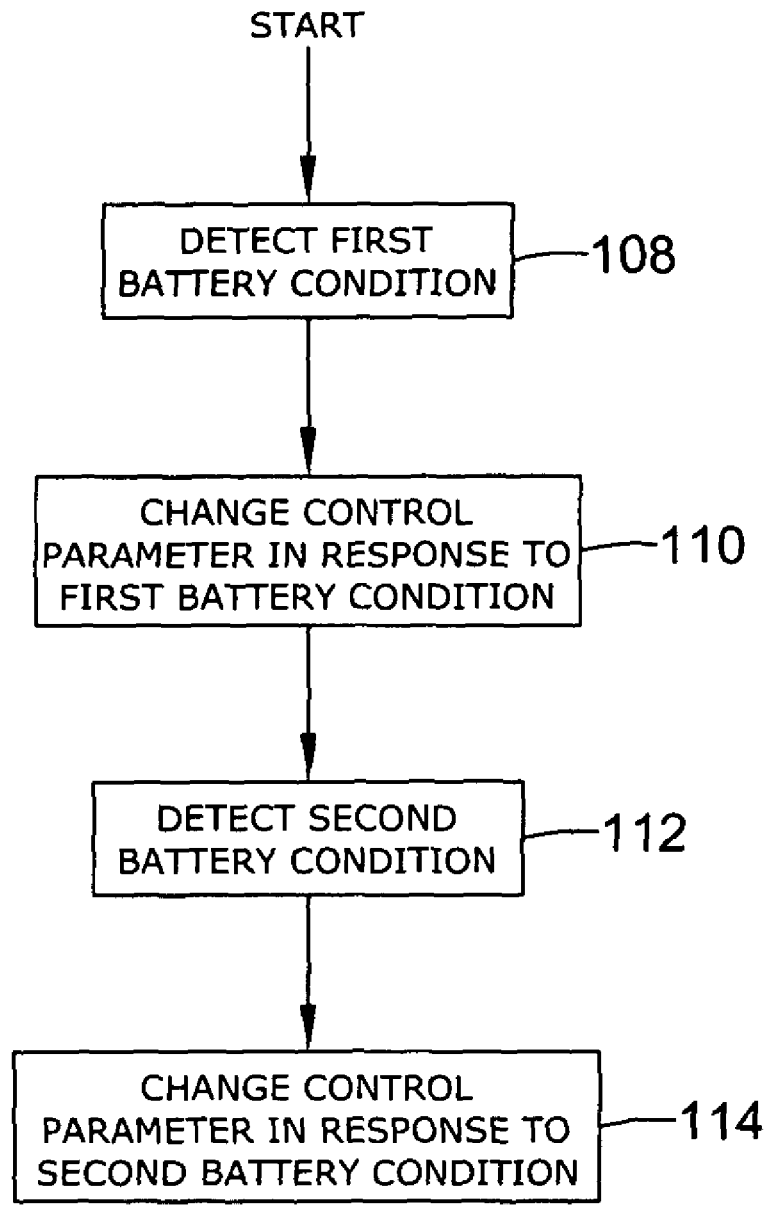
FIG. 9 is a flow diagram showing yet another illustrative method that may be implemented by the controller of FIG. 1.

FIG. 9 is a flow diagram showing an illustrative method that may be implemented by controller 10 (FIG. 1). At block 108, BATTERY BLOCK 62 (FIG. 1) detects a first battery condition. In some cases, the first battery condition can represent a first low battery condition. Control passes to block 110, where a control parameter is changed in response to the first battery condition. If, for example, the control parameter is a temperature set point of 70 degrees Fahrenheit, controller 10 (FIG. 1) may change the temperature set point higher or lower (e.g. 72 or 68) degrees Fahrenheit in response to the first battery condition. In some cases, the first change in temperature set point may be, for example, less than 10° F., less than 8° F., less than 5° F., or less than 3° F. In some embodiments, the change in the control parameter value cannot be overridden by the user, except by replacing the battery.

At block 112, BATTERY BLOCK 62 (FIG. 1) detects a second battery condition. In an illustrative embodiment, the second battery condition may correspond to a battery voltage that is less than the battery voltage of the first battery condition. In some embodiments, BATTERY BLOCK 62 (FIG. 1) can continuously monitor the voltage of the battery 60, while in other embodiments, the voltage of the battery 60 may be monitored at discrete times.

Control passes to block 114, where controller 10 (FIG. 1) changes the control parameter in response to the second battery condition. In some instances, this can involve changing the control parameter that was changed in response to the first battery condition a greater amount than it was changed in response to the first battery condition. For example, if the temperature set point was changed by 3° F. in response to the first battery condition, the temperature set point may be changed by 8° F. in response to the second battery condition. In some cases, the temperature set point may be changed by less than 15° F. in response to the second battery condition, but this is not required in all embodiments.

Alternatively, or in addition, a different control parameter may be changed in response to the second battery condition. The change amount can refer to the new control parameter value with respect to its original value, or to its value as changed in response to the first battery condition.

In another example, if the control parameter is a temperature set point, controller 10 may change the temperature set point any suitable amount, such as 3 degrees, to a new set point of 67 degrees in response to the first battery condition. Then, the controller 10 may change the temperature set point by another 3 degrees to a new set point of 64 degrees in response to the second battery condition.

Alternatively, or in addition, controller 10 (FIG. 1) can change the allowable temperature swing control point or the cycle rate in order to help communicate the degrading battery condition. While not explicitly shown in FIG. 10, BATTERY BLOCK 62 (FIG. 1) can continue to monitor the condition of battery 60 (FIG. 1) and provide a series of additional low battery signals. Controller 10 can continue to make increasingly larger and larger changes in a control parameter(s) in order to provide a series of increasingly urgent indications that battery replacement is becoming increasingly critical.

Figure 10:
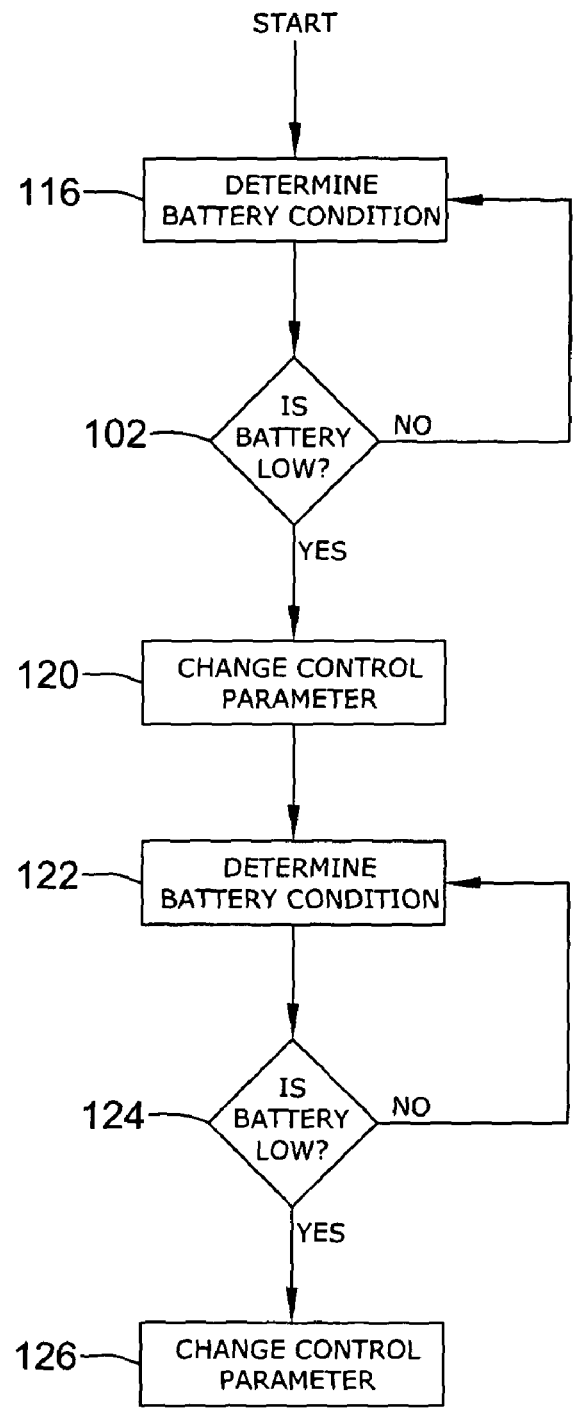
FIG. 10 is a flow diagram showing yet another illustrative method that may be implemented by the controller of FIG. 1.
Figure 11:
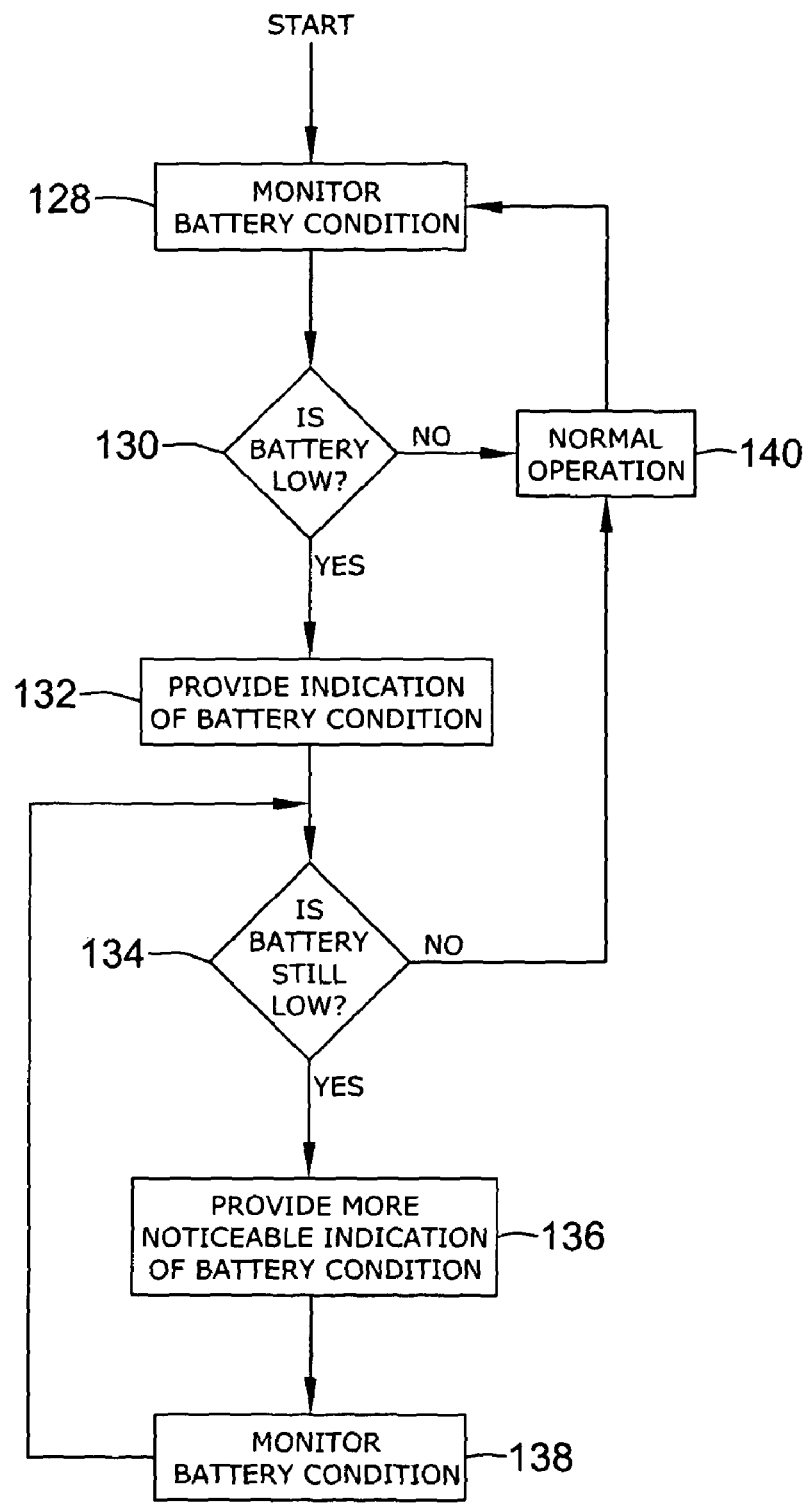
FIG. 11 is a flow diagram showing yet another illustrative method that may be implemented by the controller of FIG. 1.

Thus far, the flow diagrams have largely illustrated controller 10 (FIG. 1) operation assuming that a low battery condition already exists. FIGS. 10 and 11 provide a somewhat broader basis for controller 10 operation. In FIG. 10, control begins at block 116, where BATTERY BLOCK 62 (FIG. 1) determines the condition of battery 60 (FIG. 1). At decision block 102, a determination is made as to whether battery 60 has reached a low battery condition. The criteria that define a low battery condition can vary as discussed previously. If a low battery condition has not been reached for battery 60, control returns to block 116.

If a low battery condition has been reached for battery 60, control passes to block 120, where controller 10 (FIG. 1) changes a control parameter in response to the low battery condition. At block 122, BATTERY BLOCK 62 (FIG. 1) once again determines the condition of battery 60 (FIG. 1). Thus, a user has been given an opportunity to replace or recharge battery 60. At decision block 124, a determination is once again made as to whether battery 60 has reached a new low battery condition. In the illustrative embodiment, the new low battery condition may correspond to a lower battery voltage than the original low battery condition. If a new low battery condition has not been reached for battery 60, control returns to block 122.

If a new low battery condition has been reached for battery 60 (FIG. 1), control passes to block 126, wherein controller 10 (FIG. 1) changes the control parameter in response to the low battery condition. As discussed above, controller 10 can command a larger change in the control parameter at block 126 with respect to that commanded at block 120.

In FIG. 11, control begins at block 128, where BATTERY BLOCK 62 (FIG. 1) monitors the condition of battery 60 (FIG. 1). At decision block 130, controller 10 (FIG. 1) determines if a low battery condition exists. If battery 60 has reached a low battery condition, control passes to block 132 where controller 10 provides an indication of the low battery condition. In some illustrative embodiments, the indication can include an audible indication, a visible indication, a control parameter change, or any combination thereof.

Control then passes to decision block 134, where controller 10 (FIG. 1) determines if the low battery condition persists. If battery 60 (FIG. 1) has been replaced or recharged, control passes to block 140, representing normal controller 10 operation. Battery monitoring continues as control passes to block 128.

If battery 60 (FIG. 1) has not been replaced or recharged, and the low battery condition persists, control passes to block 136 where controller 10 (FIG. 1) provides another indication of the low battery condition. In some illustrative embodiments, the indication provided at block 136 may be more noticeable than the indication provided at block 132. The indication provided at block 136 may include, for example, an increased audible indication, an increased visible indication, a larger control parameter change, or any combination thereof. Control passes to block 138, where BATTERY BLOCK 62 (FIG. 1) continues to monitor the condition of battery 60, and thence to decision block 134.

In another illustrative embodiment, a low battery condition is detected, and subsequently thereto, a timer (e.g. provided by the controller) may be used to determine when one or more indications are provided to the user. For example, and in one illustrative embodiment, a first indication can be provided to the user when a low battery condition is detected. In some embodiments, the first indication can be provided sometime after the low battery condition is detected. A timer may then be used to determine when a second indication is provided to user, assuming the battery has not been replaced by the user. The timer may also be used to determine when a third, fourth, etc. indication are provided. In some embodiments, the second (and/or subsequent) indications may be provided a predetermined time or within a predetermined time range after the low battery condition is detected. In some embodiments, the second, third, fourth, etc. indication can be made more noticeable, be more aggressive, and/or denote a greater sense of urgency than the previous indication. In some embodiments, even the first indication may be determined by tracking the passage of a time period.

Figure 12:
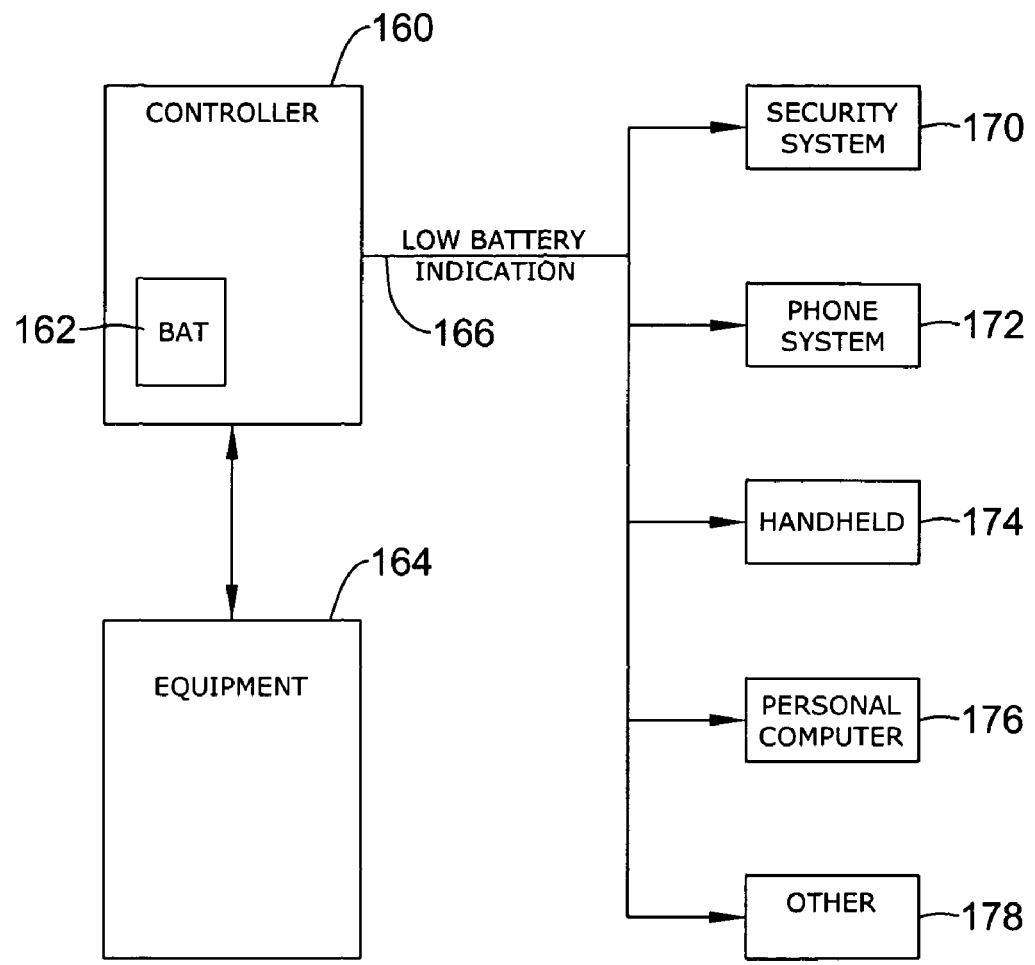
FIG. 12 is a block diagram showing another illustrative embodiment of the present invention.

FIG. 12 is a block diagram showing another illustrative embodiment of the present invention. A controller 160 is shown having a battery 162, wherein the battery 162 is used to power the controller 160 at least some of the time. For example, the battery 162 may be used to power the controller 160 all of the time, or only during power failures, etc. The controller 160 may be configured to determine when the battery 162 is low, or is expected to be low. For example, the controller 160 may include a detection circuit that detects when the voltage of the battery 162 reaches a predetermined low level. Alternatively, or in addition, the controller 160 may include a timer, which may be used to help determine the state of the battery 162 over time. In some cases, the battery life of the battery 162 may be characterized over time when used in conjunction with the controller, and this data may be used to help determine the state of the battery 162 over time.

In some embodiments, battery usage may also be monitored during the operation of the controller 160 to help determine the state of the battery 162 over time. For example, the number of times the controller 162 activates a relay or the like may be counted over time. In this example, more frequent activation of a relay may cause more battery draw, and thus may reduce the time (which may be tracked by a timer) required for the battery 162 to reach a low battery state.

The controller 160 may be any type of controller, as desired. For example, the controller 160 may be an HVAC controller, such as a thermostat, that controls HVAC equipment 164. In another example, the controller 160 may be a security system controller that controls security system equipment 164. In yet another example, the controller 160 may be a temperature sensor controller that controls temperature sensor equipment 164, or a motion sensor controller that controls motion sensor equipment 164. Virtually any type of battery powered controller may benefit from the present invention.

In the illustrative embodiment shown in FIG. 12, once the controller 160 determines that a low battery condition exists, the controller 160 may provide one or more low battery indication(s) 166. In some cases, a low battery indication 166 may be provided to one or more remote receiving devices, such as a security system 170, a phone system 172, a handheld device 174, a personal computer 176 or any other suitable receiving device 178. In one example, and if the controller 160 is a thermostat, the thermostat may provide a low battery indication 166 to a security system, which may in some cases have a better display and/or may have a display that is viewed more often by a user.

Some thermostats do not have a particularly good user interface and by providing the low battery indication 166 to another receiving device to alert the user of the low battery condition can be useful. This is also true for other devices, such as battery powered temperature sensors, battery powered motion sensors and the like, which often have a limited user interface or no user interface at all. In many cases, these devices may provide the low battery indication 166 via an RF or other wireless signal to the remote receiving device, if desired.

In some cases, the controller 160 may be adapted to call the user via a phone line, the internet and/or a cellular network and provide a message to the user and/or leave a message for the user via the phone system 172. The message may provide a notification to the user of the low battery indication 166. Alternatively, or in addition, the controller 160 may deliver a message (e.g. text messaging, email message, or any other suitable message) to a user's handheld device 174 (e.g. cell phone, Personal Digital Assistant, and/or the like) and/or to a user's Personal Computer/Laptop that provides a notification of the low battery indication 166. Numerous other remote notification mechanisms may also be used, as desired.

The invention should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

What is claimed is:

1. A method of indicating a low battery condition in an HVAC controller having a battery, the method comprising steps of:
   determining a first low battery condition by detecting a first battery voltage;
   providing a first indication in response to said first low battery condition;
   determining a second low battery condition by detecting a second battery voltage, wherein the second low battery condition is determined to be more severe than the first low battery condition;
   providing a second indication in response to said second low battery condition, wherein the second indication is more noticeable to a user than the first indication, and the second indication includes an audible indication; and
   wherein the HVAC controller is configured to control one or more units of HVAC equipment according to a programmed set point, and further wherein the first and second indications are provided while the HVAC controller continues to control the one or more units of HVAC equipment according to a programmed set point.

2. The method of claim 1 wherein the second battery voltage is lower than the first battery voltage.

3. The method of claim 1 wherein the first indication also includes an audible indication.

4. The method of claim 3 wherein the audible indication of the first indication is different than the audible indication of the second indication.

5. The method of claim 4 wherein the audible indication of the first indication includes a lower volume than the audible indication of the second indication.

6. The method of claim 4 wherein the audible indication of the first indication includes a different pitch than the audible indication of the second indication.

7. The method of claim 4 wherein the audible indication of the first indication includes more than one successive audible signals, wherein at least selected audible signals of the first indication have a first duration and a first interval between successive audible signals.

8. The method of claim 7, wherein the audible indication of the second indication includes more than one successive audible signals, wherein at least selected audible signals of the second indication have a second duration and a second interval between successive audible signals.

9. The method of claim 8, wherein the second interval is less than the first interval.

10. The method of claim 8, wherein the second duration is greater than the first duration.

11. The method of claim 4, wherein the audible indication of the second indication includes more than one successive audible signals, wherein at least selected audible signals of the second indication have a second duration and a second interval between successive audible signals.

12. The method of claim 1 wherein the first indication includes a visual indication.

13. The method of claim 1 wherein the second indication includes a visual indication.

14. The method of claim 1 wherein the first indication includes a first visual indication and the second indication includes a second visual indication, wherein the first visual indication is different from the second visual indication.

15. The method of claim 14 wherein the second visual indication is more noticeable than the first visual indication.

16. The method of claim 15 wherein the HVAC controller includes a display that normally displays one or more control parameters, and the second visual indication replaces at least some of the normally displayed control parameters.

17. The method of claim 14 wherein the first visual indication and/or the second visual indication includes a blinking LED.

18. The method of claim 1 wherein the first indication and/or the second indication include altering a control parameter of the controller.

19. A method of indicating a low battery condition in an HVAC controller having a battery and a control parameter, the method comprising steps of:
    determining a first low battery condition;
    providing a first indication after the first low battery condition is determined;
    determining a second low battery condition;
    providing a second indication after the second low battery condition is determined;
    determining a third low battery condition;
    providing a third indication after the third low battery condition is determined; wherein the second and third indications are progressively more noticeable to a user; and
    wherein the HVAC controller is configured to control one or more units of HVAC equipment according to a programmed set point, and further wherein at least two of the first, second, and third indications are provided while the HVAC controller continues to control the one or more units of HVAC equipment according to a programmed set point.

20. The method of claim 19, wherein at least one of the first and second indications is an audible indication, and wherein at least one subsequent indication is also an audible indication.

21. The method of claim 20 wherein the second audible indication is more noticeable than the first audible indication.

22. The method of claim 20, further comprising the step of providing a visual indication before the first audible indication is provided and after the first low battery condition is determined.

23. The method of claim 22, wherein the HVAC controller includes a user interface, and wherein at least one of the first, second and third indications includes disabling at least part of the user interface after the first low battery condition is determined.

24. The method of claim 19, wherein the first indication is visual, the second indication is an alteration in a temperature control parameter, and the third indication is audible.

25. The method of claim 24, wherein the alteration in the control parameter includes altering a temperature control point.

26. The method of claim 24, wherein the alteration in the control parameter includes altering a cycle rate.

27. The method of claim 24, wherein the alteration in the control parameter includes altering an allowable temperature swing.

28. The method of claim 19, wherein the first indication is visual, the second indication is audible, and the third indication is an alteration in a temperature control parameter.

29. The method of claim 28, wherein the alteration in the control parameter includes altering a temperature control point.

30. The method of claim 28, wherein the alteration in the control parameter includes altering a cycle rate.

31. The method of claim 28, wherein the alteration in the control parameter includes altering an allowable temperature swing.

32. The method of claim 19, wherein the first indication is visual, the second indication is a first audible signal, and the third indication is a second audible signal, where the first and second audible signals are different.

33. The method of claim 32, wherein the second audible signal is more noticeable than the first audible signal.

34. The method of claim 19, wherein the first indication is visual, the second indication is a first alteration in a temperature control parameter, and the third indication is a second alteration in a temperature control parameter.

35. The method of claim 34, wherein the second alteration in the temperature control parameter is more noticeable than the first alteration in the temperature control parameter.

36. A method of indicating a low battery condition in an HVAC controller having a battery, the method comprising the steps of:
    determining a low battery condition;
    providing two or more different visual indications of the low battery condition to a user, wherein at least one of the visual indications does not include flashing a low battery condition message on an LCD display; and
    wherein the HVAC controller is configured to control one or more units of HVAC equipment according to a programmed set point, and further wherein the two or more different visual indications are provided while the HVAC controller continues to control the one or more units of HVAC equipment according to a programmed set point.

37. The method of claim 36 wherein at least one visual indication includes flashing an LED.

38. The method of claim 36 wherein at least one visual indication includes blanking out an LCD display.

39. The method of claim 36 wherein the HVAC controller does not include an LCD display.

40. A method of indicating a low battery condition in an HVAC controller having a battery, the method comprising steps of:
    determining a low battery condition;
    providing a series of audible indications until the battery is replaced, wherein the series of audible indications get more noticeable over time until the battery is replaced; and
    wherein the HVAC controller is configured to control one or more units of HVAC equipment according to a programmed set point, and further wherein the series of audible indications are provided while the HVAC controller continues to control the one or more units of HVAC equipment according to a programmed set point.

41. The method of claim 40 wherein the series of audible indications include a series of beeps with a beep duration and an interval between beeps.

42. The method of claim 41 wherein the interval between beeps decreases over time.

43. The method of claim 41 wherein the beep duration increases over time.

44. The method of claim 41 wherein the beeps have a pitch, and the pitch of the beeps changes over time.

45. The method of claim 40 wherein the at least one of the audible indications includes a voice message.

* * * * *